Sept. 22, 1959 J. OLLENDORF ET AL 2,905,873

SEMICONDUCTOR POWER DEVICES AND METHOD OF MANUFACTURE

Filed Sept. 17, 1956

INVENTORS:
JOEL OLLENDORF &
JAMES BIBBY

BY J. C. Whittaker

ATTORNEY 2,905,873
Patented Sept. 22, 1959

2,905,873

SEMICONDUCTOR POWER DEVICES AND METHOD OF MANUFACTURE

Joel Ollendorf, Plainfield, and James Bibby, Raritan, N.J., assignors to Radio Corporation of America, a corporation of Delaware Application September 17, 1956, Serial No. 610,281
10 Claims. (Cl. 317—235)

Figure 1:
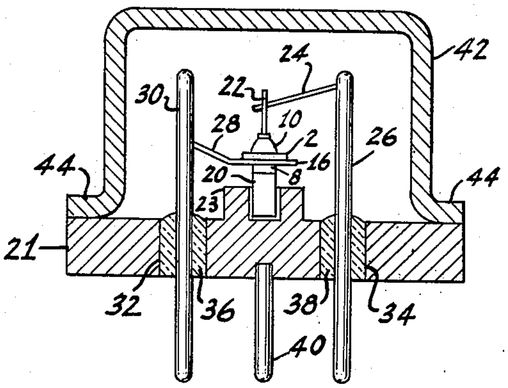

This invention relates to improved semiconductor devices and to methods of preparing them. More particularly the invention relates to an improved construction of P–N junction type semiconductor devices used in power applications.

The P–N junction type semiconductor device comprises a body of semiconductor material having at least two regions of different conductivity adjacent one another. One region may be for example, P-type while the other region is N-type. The regions have a junction therebetween which constitutes a rectifying barrier having high resistance to electrical current flow in one direction and low resistance to such current flow in the reverse direction. The conductivity types of the regions are designated as "P" or "N" depending upon whether positive type charge carriers i.e. "holes," or negative type charge carriers, i.e. electrons are present in excess in the crystal structure and able to transport current.

One type of semiconductor device is known as a transistor and may include a body of semiconductor material having regions or zones of different conductivity types separated by P–N junctions, with the various regions of the device arranged in P–N–P or N–P–N order. The zones of different types of conductivity and P–N junctions may be formed by several methods. In one method the zones and junctions are formed by a crystal growing process whereby a crystal is drawn from molten semiconductor material to which selected impurity materials capable of producing the desired conductivity types are added in a predetermined order.

Another method of establishing the zones of different conductivity is known as the alloying or fusion method. In this method two pellets of an impurity material capable of producing one type of conductivity are positioned on opposite surfaces of a semiconductor crystal whose conductivity is of the opposite type. The assembly is heated, causing the impurity material and at least some of the semiconductor crystal material to melt and dissolve into each other. Upon cooling, the molten material recrystallizes to form a P–N rectifying junction beneath each surface of the crystal and a narrow zone of conductivity type opposite that of the original crystal. Adjacent to each of these narrow zones and protruding above each surface, the solidified material comprises an alloy of the impurity material and the semiconductor material, which alloy does not have semiconductor properties.

In such transistor devices one of the two recrystallized regions of the same type of conductivity is operated as the emitter electrode and the other region is operated as the collector electrode. An ohmic non-rectifying contact electrode is bonded to the third or middle region which constitutes the base region of the device. In operation of such devices, under the control of an input signal applied between the emitter and base electrodes, the emitter electrode injects minority charge carriers into the base region. In a P–N–P transistor minority charge carriers in the base region would be holes, for example. These charges are collected by the collector electrode which is the output electrode of the device, and to which a suitable output circuit is connected. The passage or flow of electrical charges in semiconductor devices, such as the transistor described, produces heating of the devices. The problem of dissipation of the generated heat is particularly important in the operation of transistors which are required to handle considerable amounts of power. A transistor may be destroyed by excessive heating.

The problem of dissipating this heat has been solved in a number of ways. In one solution, the semiconductor device is immersed in a metallic container filled with an oil or other liquid.

Another solution employed, especially in the case of the alloy-junction transistor, has been to bond heat dissipators to the crystal and/or to one or both of the alloy regions adjacent each recrystallized region in the crystal. These heat dissipators are generally large volume metallic bodies and their use introduces several problems. As is well known and, as will be described more fully hereinafter, it is necessary to etch a transistor device in order to suitably prepare the surfaces thereof for optimum operation. If the large metallic heat dissipator is assembled after the etching operation, then the semiconductor crystal surfaces may be further contaminated by solders or fluxes, or, due to the heating required for soldering, the device may be permanently damaged or at least have its operating characteristics adversely affected.

On the other hand, if the large metal heat dissipator is bonded to the device prior to etching, then two procedures are available, neither of which is entirely satisfactory. If the device is to be electrolytically etched, then the large metallic heat dissipator must be masked with an electrically non-conductive material; otherwise the heat dissipator will be etched to the exclusion or detriment of the device itself. Such a mask, however, should be removed after etching else the characteristics of the device may be degraded thereby. Alternatively, the device may be etched by an acid, in which case the metallic heat dissipator must be masked with an acid-resistant material; otherwise the acid will etch the heat dissipator which will considerably increase the risk of contaminating the device surfaces. Applying such masks precisely to one part of a semiconductor device such as the metallic heat-dissipator is difficult and time-consuming and not consistently reliable enough to produce large numbers of uniformly satisfactory semiconductor devices.

(For clarity and uniform understanding, the following terminology is adopted in this specification and claims. The basic semiconductor body of one type of conductivity with emitter and collector electrodes of opposite conductivity alloyed thereto, and the heat-dissipating structure bonded to one of the electrodes is referred to herein as the "sub-assembly." The complete apparatus comprising the sub-assembly mounted on a stem or header and hermetically encased within a cap member sealed to the stem is referred to as the "assembly.")

One of the objects of this invention is to provide an improved semiconductor device suitable for power operation.

Another object is to provide an improved semiconductor device suitable for power operation which device may be etched and otherwise processed after sub-assembly without deleteriously affecting the device characteristics and without requiring difficult and time-consuming techniques.

Still another object of the invention is to provide an improved P–N junction type semiconductor device having good heat-dissipating characteristics.

A further object of the invention is to provide an improved method for manufacturing a semiconductor device.

Yet another object of the invention is to provide an improved method of mounting a semiconductor transistor device which may include the assembling of heat-dissipating structure therewith without deleteriously affecting the device characteristics and without involving difficult and time-consuming processing techniques.

These objects and advantages of the invention are obtained in a P–N–P or N–P–N alloy junction transistor by first sub-assembling the device with a relatively small, highly thermally conductive rod or stud soldered to one of the electrodes. All soldering and alloying is completed prior to etching which may then be accomplished without degradation of the device because the heat-conducting stud is relatively small. After etching, the device is mechanically mounted on a metallic heat-dissipating stem.

Figure 2:
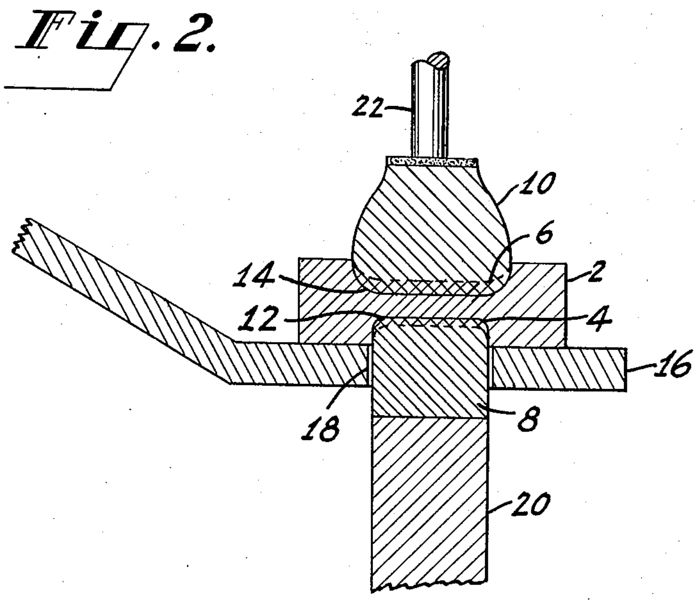

The invention is described in greater detail by reference to the accompanying drawings in which:

Figure 1 is a sectional elevational view of an alloy-junction power transistor completely assembled and mounted; and Figure 2 is a cross-sectional elevational view of an alloy junction power transistor device which is assembled but not yet mounted on the stem.

The principles of this invention are particularly applicable to P–N junction type semiconductor devices or transistors and especially to transistors prepared by an alloying or fusion method. Referring to Figure 2, a typical transistor comprises a crystal or wafer 2 of semiconductor material of germanium, silicon or the like of either N-type or P-type conductivity. For the sake of example, the crystal 2 is assumed to be N-type germanium. The wafer 2 is provided with an emitter electrode region 4 and a collector electrode region 6. When prepared by the alloy method, to be further described hereinafter, the emitter and collector electrodes also include regions 8 and 10, respectively, of ohmic conductivity. The P-type regions 4 and 6 are separated from the wafer 2 by rectifying barriers 12 and 14 respectively. The regions 8 and 10 comprise alloys of the germanium of the wafer 2 and the P-type impurity material employed.

The emitter and collector electrode regions 4 and 6 are formed on opposite surfaces of the germanium wafer 2 and are preferably concentrically aligned. Furthermore, the collector electrode region 6 is preferably, although not necessarily, made larger than the emitter electrode 4.

A base electrode tab 16 is soldered to the emitter surface of the wafer 2. This tab (which may be nickel or a nickel-iron alloy, for example) has a hole 18 provided therein large enough to admit the P-type material forming the emitter electrode region 4 without contact therewith.

The transistor sub-assembly described is made by first soldering the germanium wafer 2 to the base tab 16. This sub-assembly comprising the base tab and the germanium wafer is then placed in a suitable jig to facilitate locating the electrode materials on the germanium wafer. The electrode material for the collector electrode may be indium, for example. The emitter electrode material may be an alloy of indium, gallium and silver. This sub-assembly, while thus jigged, is heated in an atmosphere of hydrogen or an inert gas such as argon at a temperature sufficient to cause the electrode pellet materials to melt and alloy with the semiconductor block or wafer to form the desired junction electrode. The molten impurity material dissolves some of the germanium with which it is in contact. Upon cooling, this molten portion resolidifies and part of it recrystallizes forming the regions 4 and 6 which comprise semiconducting zones of monocrystalline germanium doped with a very small percentage of the impurity electrode material. The remainder solidifies to form the ohmically conducting regions 8 and 10. If the germanium wafer is of N-type semiconductor material, then any one of indium, gallium, aluminum, zinc, or boron, for example, or alloys thereof, may be used as the impurity alloying material. If the semiconductor body is of P-type germanium then any one of phosphorous, arsenic, sulphur, selenium, tellurium, antimony or bismuth, for example, may be used as the impurity alloying material.

After the device or sub-assembly has been thus formed, a relatively small silver stud 20 having a lateral cross-sectional area not larger than that of the emitter electrode is soldered or otherwise fused to the emitter electrode, for example. It should be understood that the silver stud may be connected to either the emitter or collector electrodes as desired. The stud material is preferably selected on the basis of high thermal conductivity. In addition to silver, copper or gold may be employed. It is also possible to bond the stud to the electrode during the alloying step described previously.

The wafer 2 of germanium in the example recited may be .0057″ thick and have an area of approximately .150 square inch. The collector electrode 6 illustratively may be .015″ thick and have a diameter of .100″. The emitter electrode 4 may have a diameter of .080″ and a thickness of .010″. The base tab 16 which is preferably circular may have an outside diameter of .200″ and a whole diameter of .120″.

Upon completion of the sub-assembly just described, an electrical lead 22 may be welded to the collector electrode portion 10. The device is now ready for etching. According to one technique the electrode to be etched is made the anode in an electrolytic etchant. The etchant comprises a concentrated alkaline electrolyte such as a saturated aqueous solution of potassium hydroxide. The etching procedure consists of applying a series of relatively short current pulses to the electrode being etched. The current is about 4 amperes. The typical etchant sequence is as follows: for the collector a series of five pulses of about one second duration spaced about two seconds apart is applied; for the emitter a series of two pulses of about one second duration spaced about two seconds apart is applied.

The next step is to mount the transistor sub-assembly in heat-conducting relation to a relatively large heat-dissipator which preferably is constituted by a closure member 21 more commonly referred to as a stem or header. The stem 21, which may be of copper or other good thermally conducting material, contains at least two holes, 32 and 34, therethrough. Peripheral portions of the stem 21 are also extended so as to provide a mounting surface for a cap member 42. Electrical connectors or rods 26 and 30 are inserted through the holes 32 and 34 of the stem 21 and insulatingly secured therein by means of electrically non-conductive material 36 and 38. This insulating material may be provided in the form of glass beads, for example. An electrical connector 40 is also attached to the stem 21 as by soldering, for example, or by providing a threaded recess in the stem into which the connector may be screwed. The connector 40 may also be swaged into the stem.

The transistor assembly is then mounted in a well located in the stem 21 by swaging, for example, the thermally conductive stud 20 into the well. Alternatively, the well may also be internally threaded and the stud externally threaded so that it may be screwed into the well. The stud 20 thus is rendered in heat-conducting relation with the relatively large thermally-conductive, heat-dissipating stem 21. As shown in Figure 1, the well may be provided in a pedestal 23 rising from the stem surface. After securing the stud 20 into the well of the stem 21, the collector electrode 10 is then electrically connected to the rod 26 by welding, for example, an electrically conductive wire 24 between the lead 22 and the rod 26. The base electrode 16 is electrically connected to the rod 30 by welding an integral angled extension 28 of the base electrode. These two welding operations are located sufficiently far away from the device so as to not damage it by heat from the welding. The emitter electrode 8, in addition to being in heat-conducting relation with the stem 21, is also in electrical conducting relation therewith. Thus the external electrical connection to the emitter electrode 8 may be achieved by contacting the stem 21. Conveniently, the pin or connector 40 is provided for this purpose.

The final step is to enclose the stem-mounted assembly. This is done by welding the turned-out flange portions 44 of the metallic cap 42 to the mounting surface of the stem 21.

The flange 44 of the cap 42 and the mounting surface of the stem 21 are extended outwardly so that the heat required for welding is sufficiently remote from the device itself so as not to have any significant deleterious effects thereon.

It should be understood that while the invention has been described principally in connection with a power transistor device having collector and emitter electrodes, it is by no means limited to such application. As is well known in the art of semiconductor devices a rectifying junction device, popularly termed a diode, may be obtained by simply omitting one of the rectifying electrodes in contact with the semiconductor body. Such a device thus would comprise, for example, a p-type semiconductor body having an n-type junction-forming electrode alloyed thereto. The device is completed by attaching a base contact to the semiconductor body. It is necessary, of course, to etch and otherwise process the device in the same manner required for transistor devices described heretofore. Thus in applying the invention to a diode device the relatively small thermally conductive stud is connected as heretofore to the rectifying electrode and then mounted and assembled as described.

There thus has been described a novel structure and arrangement especially for effectively dissipating heat in a power transistor device. The ultimate effect of having one of the electrodes of a power transistor lose its heat through a relatively large volume heat conductor and dissipator is achieved by thermally connecting one of the electrodes to a large volume heat radiator by a relatively small but good thermal conductor. On the other hand, the transistor still may be assembled and otherwise processed after being secured to this relatively small thermal conductor without requiring cumbersome or difficult or even detrimental process techniques.

What is claimed is:

1. Semiconductor apparatus including a cap member having an open end, a thermally conductive closure member hermetically sealed to said cap member at said open end, a semiconductor device disposed within said cap member and including a base electrode and comparatively large-area rectifying emitter and collector electrodes, one of said rectifying electrodes being secured to said closure member by means of a relatively small stud in thermal conducting relation, and a pair of electrical contact members insulatingly supported by said closure member and making electrical contact with said base electrode and the other of said rectifying electrodes.

2. The invention according to claim 1 wherein said emitter electrode is secured to said closure member by said stud.

3. The invention according to claim 1 wherein said collector electrode is secured to said closure member by said stud.

4. Semiconductor apparatus including a cap member having an open end, a thermally conductive closure member hermetically sealed to said cap member at said open end, said closure member having a well in a surface thereof within said cap member, a semiconductor device disposed within said cap member and including a base electrode and comparatively large area rectifying emitter and collector electrodes, one of said rectifying electrodes being secured in said well of said closure member by means of a relatively small stud in thermal conducting relation, and a pair of electrical contact members insulatingly supported by said closure member and making electrical contact with said base electrode and the other of said rectifying electrodes.

5. The invention according to claim 4 wherein said closure member has a pedestal rising from said surface which contains said well.

6. A semiconductor device comprising a body of semiconductor material, emitter and collector rectifying electrodes in contact with said body, a base electrode in non-rectifying contact with said body, a small-volume heat-conducting member secured in heat-conducting relation to one of said rectifying electrodes and to a closure member having an outwardly extending mounting surface, an electrical connector in contact with the other of said rectifying electrodes, and an electrical connector in contact with said base electrode, said electrical connectors being insulatingly mounted on said closure member, and a cap member hermetically sealed to said mounting surface of said closure member.

7. Semiconductor apparatus including a cap member having an open end, a thermally conductive closure member hermetically sealed to said cap member at said open end, said closure member having a well in a surface thereof within said cap member, a semiconductor device disposed within said cap member and including a base electrode and a comparatively large area rectifying electrode, said rectifying electrode being secured in said well of said closure member by means of a relatively small stud in thermal conducting relation, and a pair of electrical contact members insulatingly supported by said closure member and making electrical contact with said base electrode and said rectifying electrode.

8. The invention according to claim 7 wherein said closure member has a pedestal rising from said surface which contains said well.

9. Semiconductor apparatus including a cap member having an open end, a thermally conductive closure member hermetically sealed to said cap member at said open end, a semiconductor device disposed within said cap member and including a semiconductor wafer, a first rectifying electrode fused to one face of said wafer, a second rectifying electrode fused to the other face, said first rectifying electrode being secured to said closure member by means of a relatively small stud in thermally conducting relation, a base electrode surrounding said first rectifying electrode without contact therewith, and means for making electrical contact with said electrodes.

10. A semiconductor device comprising a body of semiconductor material, at least one rectifying electrode in contact with said body, a metallic heat-conducting member having a lateral cross-sectional area not larger than that of said rectifying electrode in heat-conducting relation, a separate thermally-conductive closure member having a pedestal portion containing a recess therein in which said heat-conducting member is connected in heat-conducting relation, and a cap member hermetically sealed to said closure member.

References Cited in the file of this patent

UNITED STATES PATENTS

| | | |
|---|---|---|
| 2,725,505 | Webster et al. | Nov. 29, 1955 |
| 2,731,704 | Spanos | Jan. 24, 1956 |
| 2,735,050 | Armstrong | Feb. 14, 1956 |
| 2,751,528 | Burton | June 19, 1956 |
| 2,757,439 | Burns | Aug. 9, 1956 |
| 2,759,133 | Mueller | Aug. 14, 1956 |
| 2,762,001 | Kilby | Sept. 4, 1956 |
| 2,777,101 | Cohen | Jan. 8, 1957 |
| 2,777,974 | Brattain et al. | Jan. 15, 1957 |
| 2,809,332 | Sherwood | Oct. 8, 1957 |
| 2,817,048 | Thuermel et al. | Dec. 17, 1957 |